(12) United States Patent
Montez et al.

(10) Patent No.: US 8,633,088 B2
(45) Date of Patent: Jan. 21, 2014

(54) GLASS FRIT WAFER BOND PROTECTIVE STRUCTURE

(75) Inventors: Ruben B Montez, Cedar Park, TX (US); Robert F Steimle, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/460,020

(22) Filed: Apr. 30, 2012

(65) Prior Publication Data

US 2013/0285228 A1    Oct. 31, 2013

(51) Int. Cl.
- *H01L 21/30* (2006.01)
- *H01L 21/00* (2006.01)
- *H01L 21/46* (2006.01)
- *H01L 23/06* (2006.01)

(52) U.S. Cl.
USPC .............. 438/456; 438/52; 438/53; 438/455; 257/684

(58) Field of Classification Search
USPC .............. 438/52, 53, 456; 257/684, E21.499
See application file for complete search history.

(56) References Cited

U.S. PATENT DOCUMENTS

| | | | |
|---|---|---|---|
| 4,849,371 A * | 7/1989 | Hansen et al. | 438/348 |
| 6,448,109 B1 | 9/2002 | Karpman | |
| 7,846,815 B2 | 12/2010 | Karlin et al. | |
| 8,039,312 B1 | 10/2011 | Gunturu et al. | |
| 8,058,143 B2 | 11/2011 | Montez et al. | |
| 8,119,431 B2 | 2/2012 | Park et al. | |
| 8,138,062 B2 | 3/2012 | Liu et al. | |
| 2010/0244159 A1 * | 9/2010 | Karlin et al. | 257/415 |
| 2010/0297781 A1 * | 11/2010 | Scheurle | 438/5 |
| 2011/0133294 A1 * | 6/2011 | Park et al. | 257/415 |
| 2011/0143476 A1 * | 6/2011 | Liu et al. | 438/51 |

* cited by examiner

*Primary Examiner* — Steven Loke
*Assistant Examiner* — Juanita B Rhodes
(74) *Attorney, Agent, or Firm* — David G. Dolezal; Mary Jo Bertani (57) ABSTRACT

A bonded semiconductor device comprising a support substrate, a semiconductor device located with respect to one side of the support substrate, a cap substrate overlying the support substrate and the device, a glass frit bond ring between the support substrate and the cap substrate, an electrically conductive ring between the support substrate and the cap substrate. The electrically conductive ring forms an inner ring around the semiconductor device and the glass frit bond ring forms an outer bond ring around the semiconductor device.

20 Claims, 7 Drawing Sheets

GLASS FRIT WAFER BOND PROTECTIVE STRUCTURE

BACKGROUND OF THE INVENTION

1. Field of the Invention

This invention relates to semiconductor devices formed from wafers bonded with a glass frit.

2. Description of the Related Art

With some types of semiconductor devices such as micro electrical mechanical systems (MEMS) devices, it is desirable to seal the device (e.g. hermetically) for proper operation of the device. For example, it is desirable to seal a MEMS accelerometer in a chamber to prevent contamination of the moving parts of the accelerometer during subsequent processes and during operation. One method for sealing a MEMS device is to bond a cap wafer to a device wafer with a glass frit.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

In some embodiments, a bonded semiconductor device die can be formed by bonding two wafers with an outer glass frit bond and an inner ring that provides an electrically conductive path between structures of the two wafers. In addition, the inner ring also provides a stop that prevents the glass frit from overflowing to the semiconductor device during the wafer bonding process. Also, in some embodiments, the inner ring may prevent gasses produced by the frit bonding process from contaminating the semiconductor device.

Figure 1:
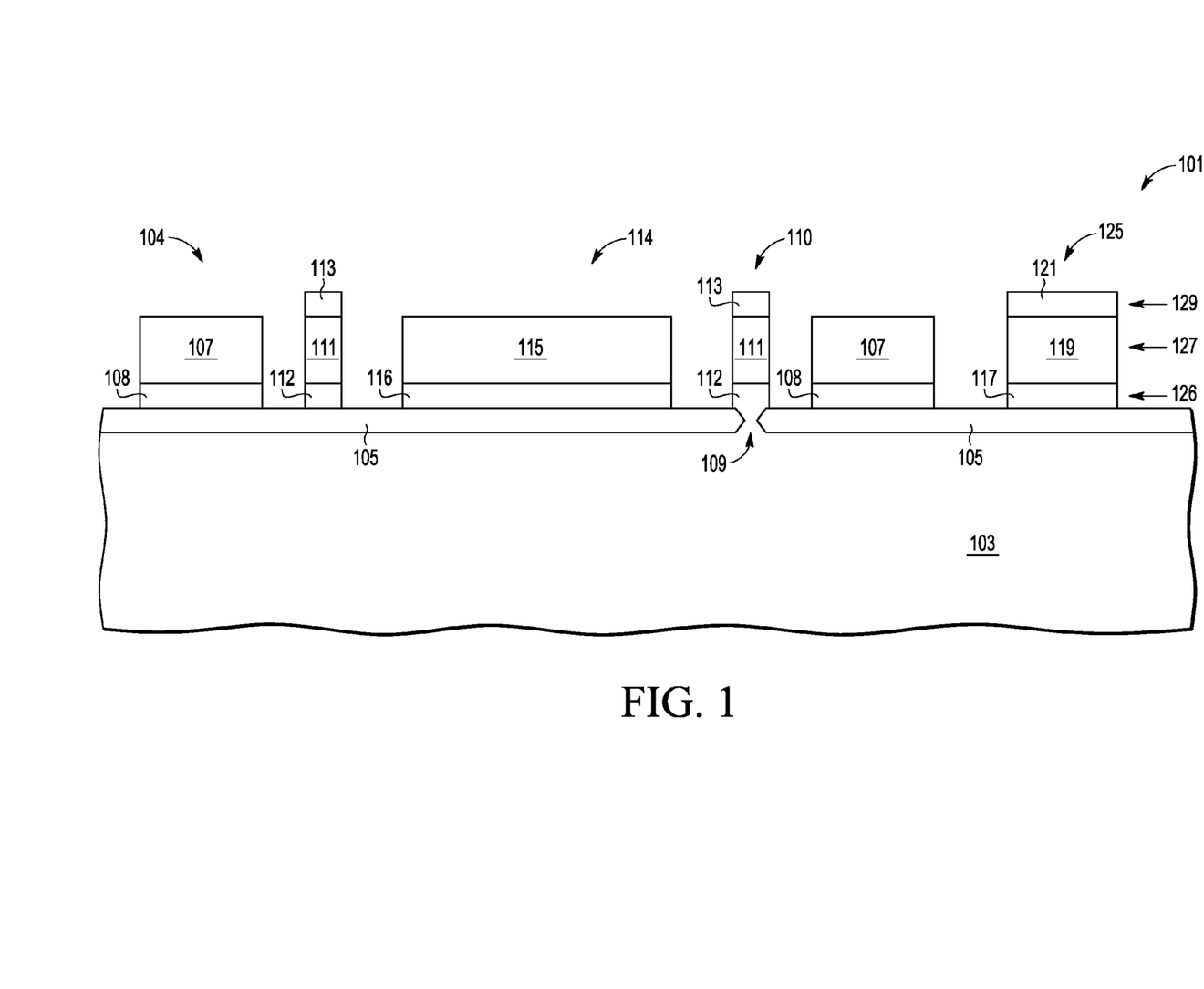
FIGS. 1-8 sets forth various views of a semiconductor device at different stages in its manufacture according to one embodiment of the present invention.

FIG. 1 is a partial side view of a device wafer 101. In the embodiment shown, device wafer 101 includes a substrate 103 made of e.g., bulk mono crystalline silicon. A dielectric layer 105 is located on substrate 103.

Located on dielectric layer 105 are outer ring 104, inner ring 110, semiconductor device 114, and bond pad 125. In the embodiment shown, outer ring 104, inner ring 110, semiconductor device 114, and bond pad 125 each include structures formed from two poly silicon layers. Ring 104 includes structure 108 and structure 107. Inner ring 110 includes structures 112 and 111. Semiconductor device includes structures 116 and 115, and pad 125 includes structures 117 and 119. Structures 108, 112, 116, and 117 are made from a layer 126 of patterned poly silicon, and structures 107, 111, 115, and 119 are made from a layer 127 of patterned poly silicon formed over layer 126. In addition, inner ring 110 and pad 125 each include a conductive metal layer (structure 113 and structure 121, respectively) formed form a layer 129 of metal (e.g. an aluminum layer with 0.5% copper). In one embodiment, layers 126 and 127 are doped with a conductivity dopant (e.g. boron, phosphorous, or arsenic).

In one embodiment, layer 105 has a thickness of 25000 angstroms, layer 126 has a thickness of 3500 angstroms, layer 127 has a thickness of 250,000 angstroms, and layer 129 has a thickness of 14,000 Angstroms. However, these layers may be of other thickness and/or be made of other materials in other embodiments. For example, layer 127 may have a thickness of 30,000 angstroms. Also in other embodiments, wafer 101 may have a different configuration including a different number and/or types of layers. For example, rings 104 and 110 may include a greater or lesser number of layers.

In one embodiment, semiconductor device 114 is a MEMS device. Examples of MEMS devices include accelerometers, gyroscopes, pressure sensors, switches, and mini motors. In one embodiment, device 114 is a "teeter totter" accelerometer. However, device 114 may be another type of semiconductor device, e.g. an integrated circuit that includes a processor, memory device, RF components, logic, and/or analog devices. In other embodiments, semiconductor device may be a discrete component (e.g. a capacitor, resistor, or inductor).

Device 114 may also include dielectric and metal layers (not shown) that are selectively patterned to form the specific structures of the device. For example, dielectric layers (e.g. silicon dioxide, nitride) may be located between structures 116 and 115 for electrical isolation. Also, device 114 may include multiple structures formed from each layer 126 and 127.

In the embodiment shown, layer 105 includes openings (e.g. 109) so that ring 110 can be in electrical contact with substrate 103. In one embodiment, these openings may be formed by forming an oxidation barrier at locations of the openings prior to oxidizing substrate 103 to form layer 105. However, in another embodiments, layer 105 may be selectively etched at the location 109, e.g. as where layer 105 is formed from a deposited layer of dielectric material.

Figure 2:
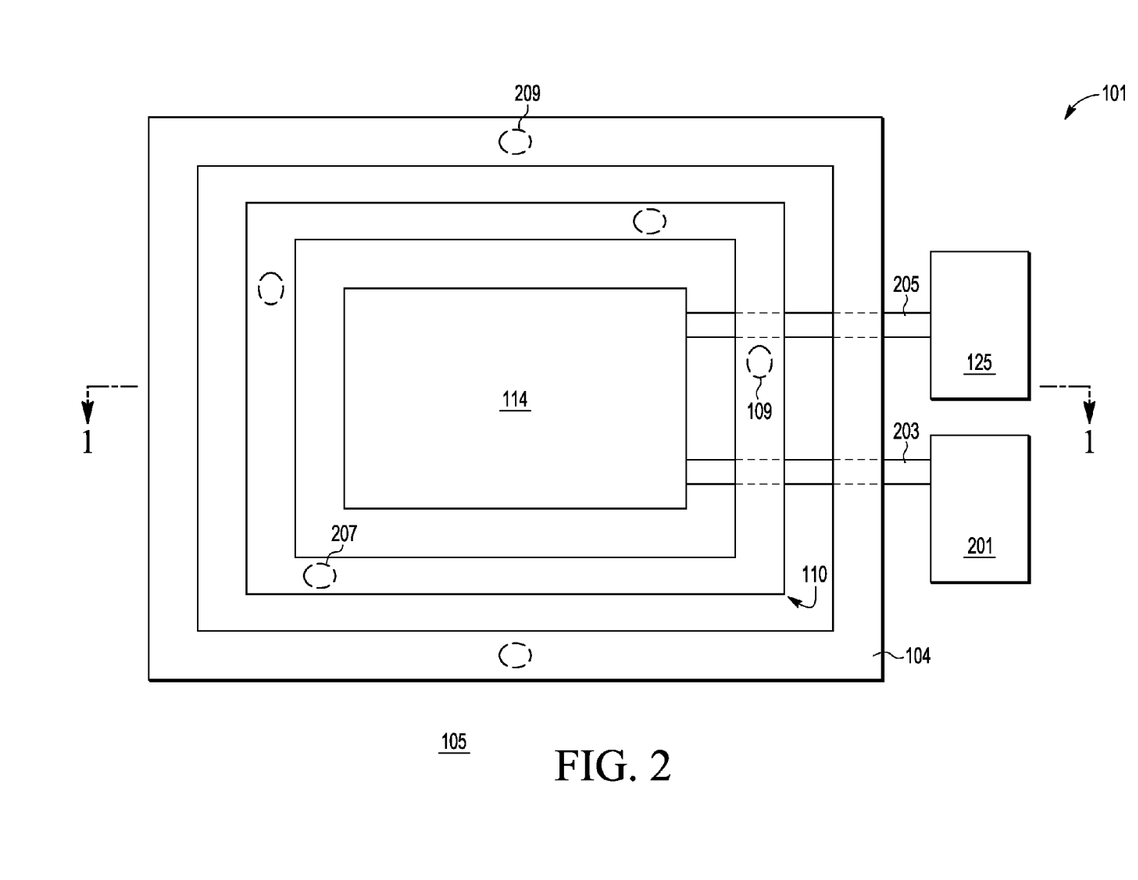

FIG. 2 shows a partial top view of wafer 101. As shown in the embodiment of FIG. 2, inner ring 110 is continuous in that is completely surrounds device 114. Outer ring 104 is also continuous in that it completely surrounds inner ring 110 and device 114. Bond pad 125 is located outside of rings 104 and 110. In the embodiment shown, electrical traces (205) electrically couple device 114 to the bond pads. In one embodiment, the traces (205) are formed from layer 126, where poly silicon of the traces are electrically isolated by dielectric material (not shown) from the poly silicon of structures 111 and 112 of ring 110 and structures 108 and 107 of ring 104.

Shown in dashed lines are the locations of openings (109, 207) in layer 105 where structure 112 is in electrical contact with substrate 103. Also shown in dashed lines in the embodiment of Figure are openings (209) in layer 105 where structure 108 is in electrical contact with substrate 103.

Although not shown, wafer 101 may include multiple sections similar to that shown in FIG. 2 where each section will be subsequently singulated to form an individual die with a bonded semiconductor device in subsequent processes. Also in other embodiments, multiple semiconductor devices may be located within an inner ring (110) and outer ring (104). Furthermore, the rings may have different shapes (e.g. oval, circular) other than the rectangular shape shown in FIG. 2. Also, in other embodiments, the outer rings of adjacent sections may share segment portions.

Figure 3:
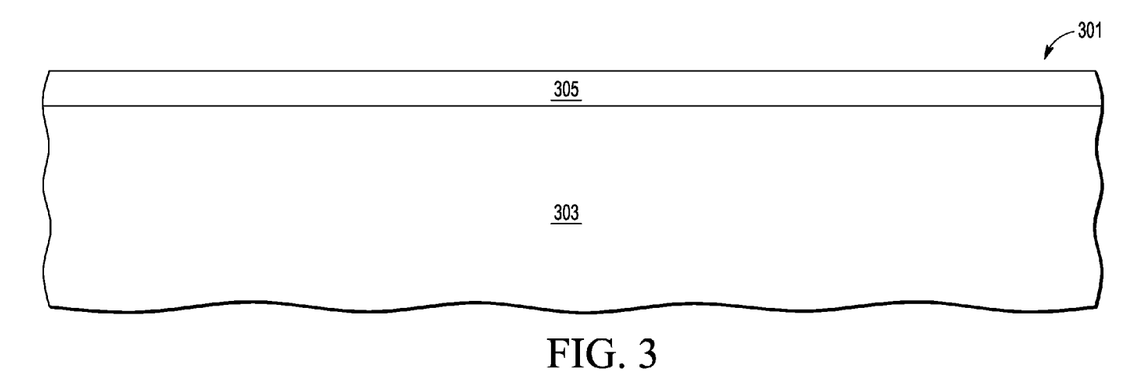

FIG. 3 is a partial side view of a cap wafer 301. Cap wafer 301 includes a substrate 303 which in one embodiment is made of bulk mono crystalline silicon, but may be made of other materials (e.g. other semiconductor materials) in other embodiments. In one embodiment, substrate 303 is doped with a conductivity dopant (e.g. arsenic, phosphorous, or boron).

A layer 305 of doped mono crystalline silicon is located over substrate 303. In one embodiment, layer 305 has a higher net conductivity dopant concentration than substrate 303. In one embodiment, layer 305 is formed by ion implanting conductivity dopants into a top portion of substrate 303. In other embodiments, layer 305 is formed by epitaxially growing in-situ doped mono crystalline silicon on substrate 303. In one embodiment, layer 305 is doped with n-type conductivity dopant (e.g. phosphorous, arsenic) having a conductivity dopant concentration of greater than $8e^{19}$ atoms per $cm^3$. However, layer 305 may have a different doping concentration and may be doped with different conductivity dopants (e.g. boron), in other embodiments. In one embodiment, substrate 303 has doping concentration to provide a bulk resistivity of 10±5 ohms-cm. Layer 305 has a bulk resistivity of less than 1.4 mohms-cm. For such a resistivity range, substrate 303 has a lower net dopant concentration than layer 305. In one embodiment, wafer 301 may be highly doped to meet the desired resistivity of layer 305 such that additional doping to form layer 305 is not needed. In one embodiment, layer 305 has a thickness of 6 micrometers, but may have thicknesses in other embodiments.

Figure 4:
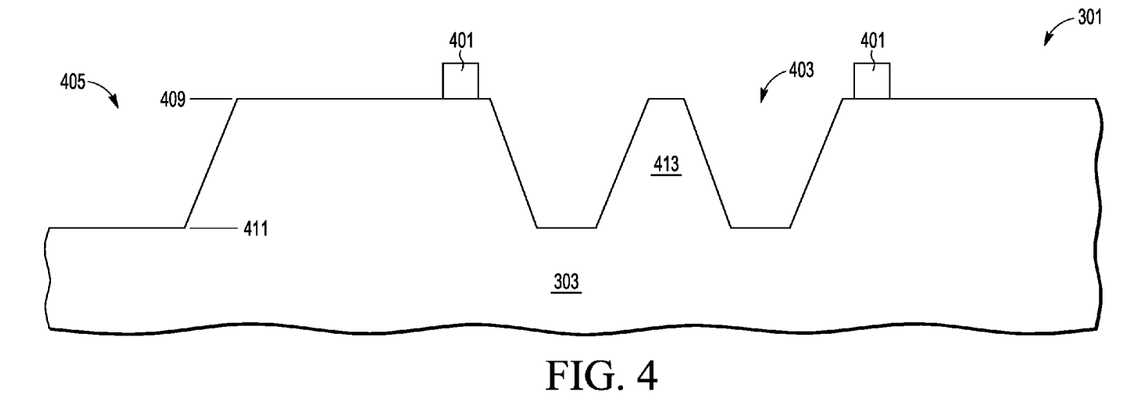

FIG. 4 shows a partial side view of wafer 301 after wafer 301 has been etched to form various structures. In the embodiment shown, layer 305 has been patterned to form an inner ring 401. Also substrate 303 has been etched to form device cavity 403 and pad cavity 405. A Z-directional stop 413 is located in cavity 403. Ring 401 surrounds cavity 403. In one embodiment, ring 401 has a width of 25 microns, but may have other widths in other embodiments.

In one embodiment, the structures of wafer 301 in FIG. 4 are formed by first etching layer 305 to form ring 401. In one embodiment, a layer of photo resist (not shown) is formed over wafer 301 where the remaining portion of layer 305 is exposed to an etchant for removal with a timed etch to level 409. Afterwards an oxide (not shown) is deposited on wafer 301 and patterned to remove the oxide over the regions of the device cavity 403 (excluding over stop 413) and pad cavity 405. The wafer is then subjected to a timed isotropic etch where portions of the substrate 303 are removed to level 411. In one embodiment, tetramethylammonium hydroxide is used as an etchant where the etch boundaries follow the crystalline plane of the <100> crystalline orientation of silicon substrate 303. The patterned oxide is then removed. The structures shown in FIG. 4 may be made by other processes in other embodiments. Also, wafer 301 may have other structures and/or configurations in other embodiments.

Figure 5:
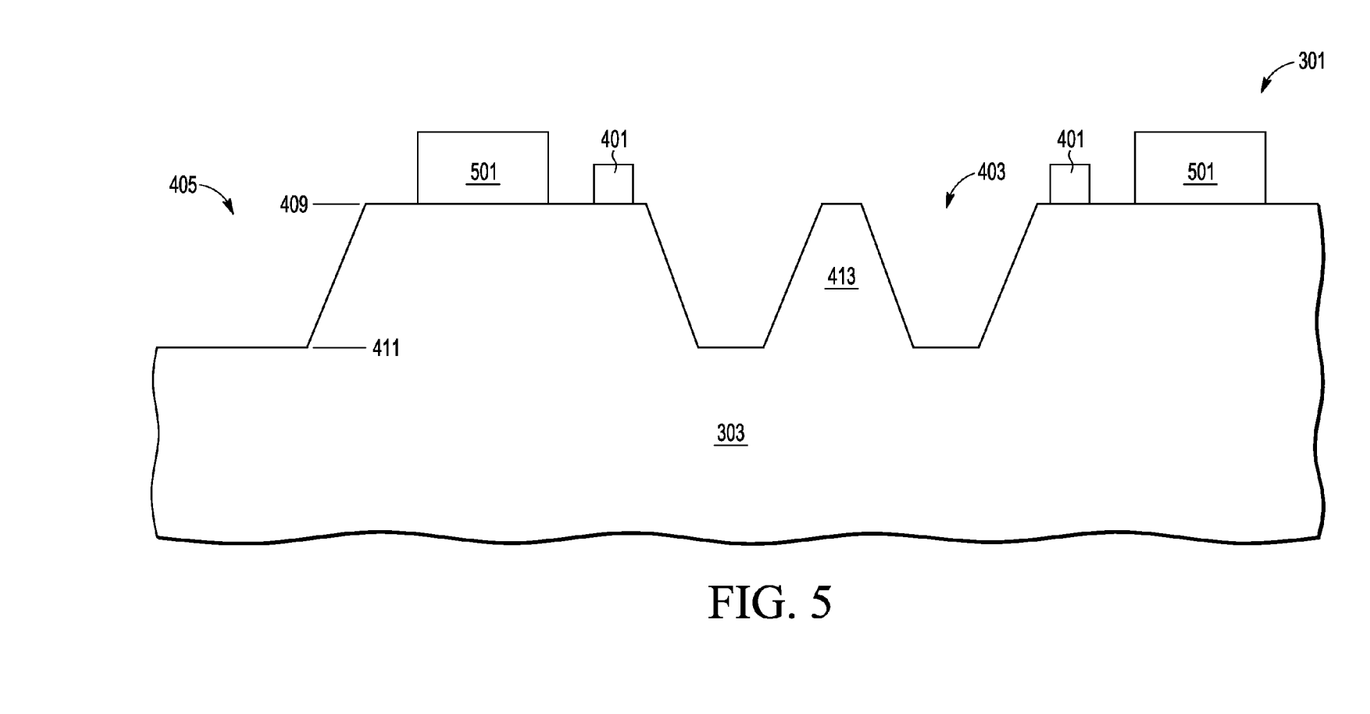

FIG. 5 shows a partial side view of wafer 301 after a ring 501 of glass frit is applied to wafer 301. In one embodiment, the glass frit includes lead. In one embodiment, the glass frit is applied through a screen printing process, but may be applied by other methods in other embodiments. In one embodiment, glass frit ring 501 has a thickness of 14 microns and a width (the horizontal direction in FIG. 5) of 150 microns. However, ring 501 may be other dimensions and/or have other configurations in other embodiments.

In an embodiment where multiple devices are formed on a wafer 101, the glass frit ring 501 may have a width such that it extends into a portion of an adjacent device region (not shown) of cap wafer 301. The frit ring would be separated when the wafers are singulated. Thus, a portion of the glass frit ring as applied would also serve as a portion of the glass frit ring for adjacent device regions.

Figure 6:
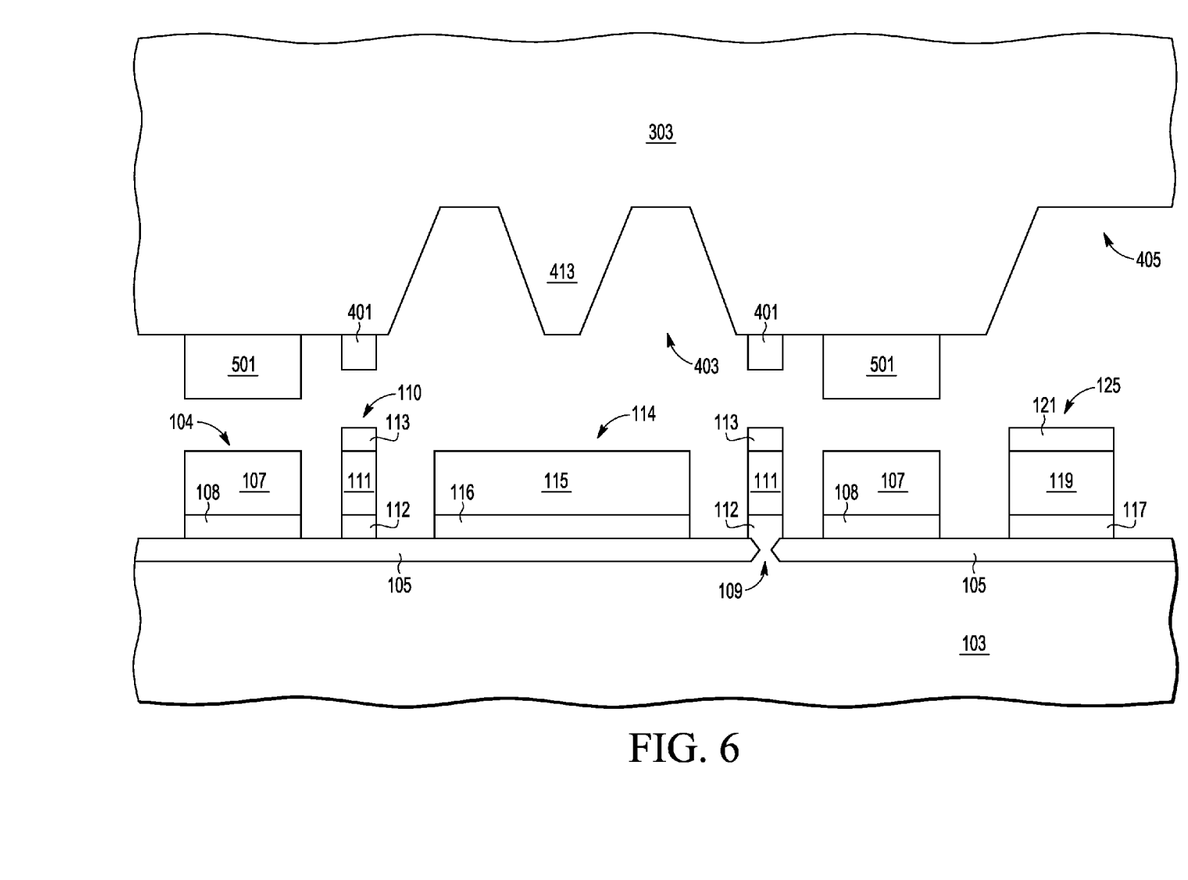

Referring to FIG. 6, after the formation of wafer 301 at the stage of FIG. 5, wafer 301 is flipped over and aligned with wafer 101 where ring 501 is aligned with ring 104 and ring 401 is aligned with ring 110. In the alignment shown, cavity 403 is located over device 114 and cavity 405 is located over pad 125. In an embodiment where a portion of ring 501 is also used to seal an adjacent device, ring 501 may be aligned such that a portion of its width for one segment is located over ring 104 and also over an adjacent ring portion (not shown) of the adjacent device portion (not shown) of wafer 101.

Figure 7:
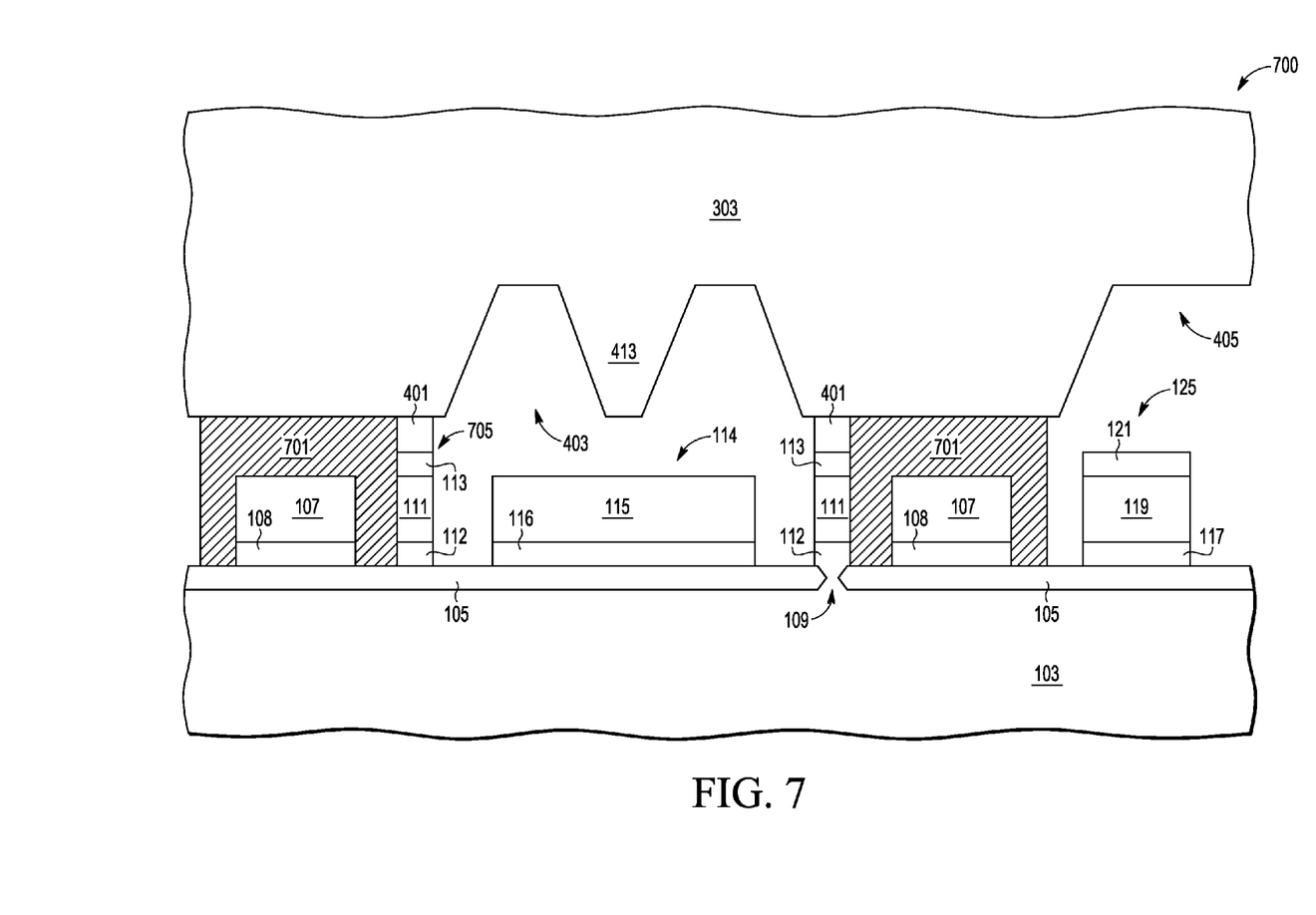

FIG. 7 is a partial side view of the wafers 301 and 101 after they have been bonded together to form a composite wafer 700. In one embodiment, the wafers are bonded at a temperature in the range of 400-450 C and under an ambient pressure in the range of 1-2400 Torr. Also, a bonding pressure in the range of 5,000-10,000 millibars is applied to the wafers during bonding. However, the wafers maybe bonded at other temperatures, atmospheric pressures, and/or bonding pressures in other embodiments. In one embodiment, wafers 101 and 301 are bonded in a multi chamber bonding tool where they are aligned and then clamped together. After clamping, heat and bonding pressure are applied to the wafers.

During the bonding process, the top surface of structure 113 of ring 110 contacts and forms an electrically conductive bond 705 with lower surface of ring 401. In one embodiment, this electrically conductive bond is formed by contact of the aluminum of structure 112 and the doped mono crystalline silicon of ring 401. In some embodiments, the silicon migrates into the aluminum during the bonding process.

In the embodiment shown, during the bonding process, the glass frit material 701 of ring 501 overflows around the sides of ring 104. The seal of ring 401 and ring 110, serves as a frit stop that prevents the glass frit material 701 from reaching device 114.

Accordingly, providing an inner ring to separate the semiconductor device from the grass frit ring may in some embodiments, provide for a process where the frit material can be applied with lower manufacturing tolerances. With the use of a frit stop, a greater amount of frit material may be applied to the ring without the concern of the frit over flowing into the semiconductor device.

In one embodiment, the seal of frit material to ring 104 bonds the wafers and forms a hermetic seal of the cap wafer to the device wafer. In other embodiments, the seal may not be hermetic. In other embodiments, ring 104 (or other wafer structure) may have an opening to expose the device to atmospheric conditions after bonding.

Figure 8:
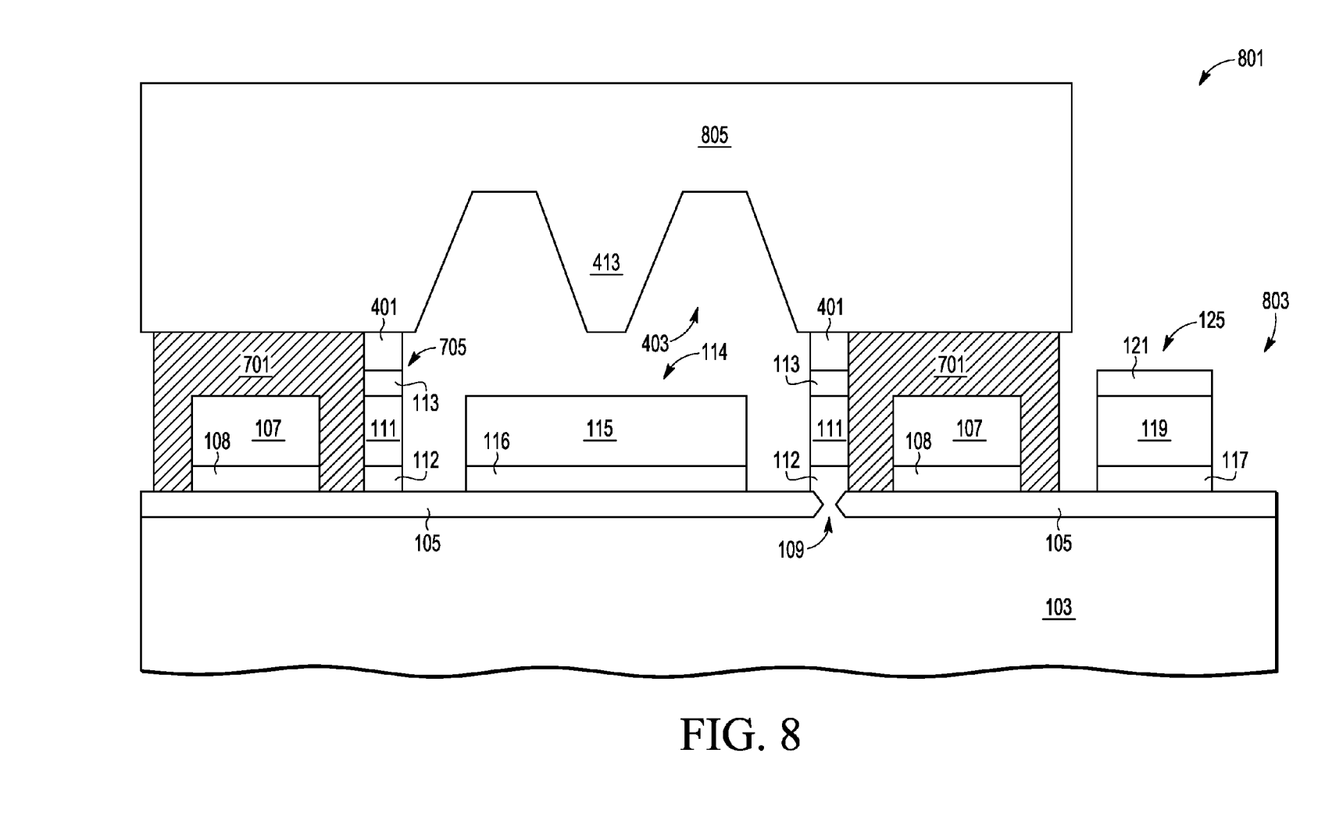

FIG. 8 is a side view of a bonded semiconductor device 801. Device 801 is formed by singulating the bonded wafers shown in FIG. 7. Prior to singulation, cap wafer 301 is removed over the location of the bond pads (125) to expose the pads. Afterwards the bonded wafers are singulated (e.g. with a saw or laser) to form multiple bonded devices such as device 801.

In some embodiments where ring 501 extends (laterally in the view of FIG. 7) to other device regions of cap wafer 301 and device wafer 101, the singulation is performed to separate the glass frit material 701 between the device regions. Also in other embodiments, a portion of ring 104 may extend (laterally in the view of FIG. 7 over to an adjacent device region of wafer 101 such that that segment also serves as a portion of the outer ring for the adjacent device (not shown). During singulation, that portion of ring 104 would be separated where a remaining half would go to each singulated device.

In some embodiments, the portion of cap wafer of device 801 is electrically grounded via the electrically conductive contact between ring 401 and ring 110. Accordingly, with some embodiments, an additional cap grounding structure is not needed.

In subsequent processes, device 801 may be implemented in an electronic package and e.g. encapsulated with other devices such a processor or controller where the pads (125) are electrically coupled (e.g. by wire bonding) to the other circuitry for operation. The package can be implemented in an electronic system (e.g. computer, cell phone, or motor control unit for an automobile).

In other embodiments, the inner ring may be discontinuous such that there may be openings in the ring (e.g. in the corners). Providing openings in the inner ring may provide for more interlocking strength of the frit bond where portions of frit material 701 reside in between portions of the inner ring.

Also, in some embodiments, the inner ring not only prevents glass frit material 701 from flowing to the semiconductor device, but it may also prevent gasses (e.g. gaseous lead) from contaminating the semiconductor device during the bonding process. In some embodiments, gaseous lead may lead to undesirable whisker formation on the silicon structures of the semiconductor device 114.

In some embodiments, a ring segment similar to a segment of ring 401 and ring 110 may be formed between the outer ring 104 (and 501) and the pads (125) to prevent the glass frit material from overflowing to the pads. See for example, FIG. 2 where such a ring segment would be located between the right side of ring 104 and the bond pads 201 and 125. In some embodiments where a device wafer includes rows of device regions, rings having the same structures as rings 110 and 401 would be formed around the group of pads of the wafer 100 and around cavity 405 of wafer 301, respectively, to keep the glass frit from over flowing on the pads during the bonding process.

One advantage that may occur with some embodiments described herein is that an electrically conductive contact can be formed between the device substrate and cap portion without a poly silicon or metal layer formed on the cap wafer for such purposes. However in some embodiments, such materials may be formed on the cap wafer.

In one embodiment, a bonded semiconductor device includes a device substrate with a semiconductor device located with respect to one side of the device substrate, a cap substrate overlying the one side of the device substrate and the semiconductor device, and a glass frit bond ring between the device substrate and the cap substrate. The device includes an electrically conductive ring between the device substrate and the cap substrate, wherein the electrically conductive ring forms an inner ring around the semiconductor device and the glass frit bond ring forms an outer ring around the semiconductor device.

In another embodiment, a method of manufacturing a bonded semiconductor device includes forming a polysilicon ring over a support substrate. The polysilicon ring surrounds a semiconductor device. The method includes forming conductive contact material over the polysilicon ring, forming a mono crystalline ring over a cap substrate, and forming a glass frit ring of material over the cap substrate. The glass frit ring surrounds the mono crystalline ring. The method also includes bonding the cap substrate to the support substrate with at least the glass frit ring such that the mono crystalline ring contacts the conductive contact material for forming an electrically conductive ring.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method of manufacturing a bonded semiconductor device comprising:
   forming a polysilicon ring over a support substrate, the polysilicon ring surrounding a semiconductor device;
   forming conductive contact material over the polysilicon ring;
   forming a mono crystalline ring over a cap substrate;
   forming a glass frit ring of material over the cap substrate, the glass frit ring surrounding the mono crystalline ring;
   bonding the cap substrate to the support substrate with at least the glass frit ring such that the mono crystalline ring contacts the conductive contact material for forming an electrically conductive ring.

2. The method of claim 1 further comprising:
   forming a second polysilicon ring surrounding and spaced apart from the polysilicon ring over the support substrate;
   wherein the bonding includes bonding such that the glass frit ring of material contacts the second polysilicon ring.

3. The method of claim 1, wherein the electrically conductive ring prevents glass frit of the glass frit ring from flowing in an area where the semiconductor device is located.

4. The method of claim 1, wherein the electrically conductive ring is discontinuous.

5. The method of claim 1, wherein the electrically conductive ring is continuous.

6. The method of claim 1, wherein:
   the electrically conductive ring provides electrical ground path for the cap substrate.

7. The method of claim 1, wherein the forming the mono crystalline ring includes:
   forming an epitaxial layer on the cap substrate;
   patterning the epitaxial layer to form the mono crystalline ring.

8. The method of claim 1, wherein the forming the mono crystalline ring of material includes:
   implanting a top portion of the cap substrate with a conductivity dopant;
   patterning the top portion to form the mono crystalline ring.

9. The method of claim 1, wherein the mono crystalline ring is of a material that has a lower bulk resistivity than a mono crystalline semiconductor material of the cap substrate.

10. The method of claim 1 wherein the semiconductor device is hermetically sealed at least by the cap substrate being bonded by the glass frit bond ring to the support substrate.

11. The method of claim 1 wherein the conductive contact material is characterized as a metal.

12. The method of claim 1 further wherein an electrically conductive pad is located over the support substrate located outside the electrically conductive ring and the glass frit ring.

13. The method of claim 1 wherein the support substrate includes a layer of dielectric material located over a layer of semiconductor material, the layer of dielectric material including an opening wherein the electrically conductive ring is in electrical contact with the layer of semiconductor material through the opening.

14. The method of claim 2, wherein the electrically conductive ring prevents glass frit of the glass frit ring from flowing in an area where the semiconductor device is located.

15. The method of claim 2, wherein:
   the electrically conductive ring provides electrical ground path for the cap substrate.

16. The method of claim 2, wherein the forming the mono crystalline ring includes:
   forming an epitaxial layer on the cap substrate;
   patterning the epitaxial layer to form the mono crystalline ring.

17. The method of claim 2, wherein the forming the mono crystalline ring of material includes:
   implanting a top portion of the cap substrate with a conductivity dopant;
   patterning the top portion to form the mono crystalline ring.

18. The method of claim 2, wherein the mono crystalline ring is of a material that has a lower bulk resistivity than a mono crystalline semiconductor material of the cap substrate.

19. The method of claim 2 wherein the semiconductor device is hermetically sealed at least by the cap substrate being bonded by the glass frit bond ring to the support substrate.

20. The method of claim 2 further wherein an electrically conductive pad is located over the support substrate located outside the electrically conductive ring and the glass frit ring.

* * * * *